United States Patent [19]

Chen

[11] Patent Number: 6,110,790
[45] Date of Patent: Aug. 29, 2000

[54] METHOD FOR MAKING A MOSFET WITH SELF-ALIGNED SOURCE AND DRAIN CONTACTS INCLUDING FORMING AN OXIDE LINER ON THE GATE, FORMING NITRIDE SPACERS ON THE LINER, ETCHING THE LINER, AND FORMING CONTACTS IN THE GAPS

[75] Inventor: Chih Ming Chen, Hsinchu, Taiwan

[73] Assignee: Worldwide Semiconductor Manufacturing Corporation, Hsinchu, Taiwan

[21] Appl. No.: 09/327,093

[22] Filed: Jun. 4, 1999

[51] Int. Cl.[7] ...................... H01L 21/331; H01L 21/8228
[52] U.S. Cl. .................. 438/305; 438/229; 438/230; 438/303
[58] Field of Search ............................................. 438/305

[56] References Cited

U.S. PATENT DOCUMENTS

| | | |
|---|---|---|
| 5,736,446 | 4/1998 | Wu ........................................... 438/305 |
| 5,770,507 | 6/1998 | Chen et al. .............................. 438/305 |
| 5,792,671 | 8/1998 | Lee .......................................... 438/305 |
| 5,918,134 | 6/1999 | Gardner et al. .......................... 438/305 |
| 6,005,272 | 12/1999 | Gardner et al. .......................... 257/344 |

*Primary Examiner*—Charles Bowers
*Assistant Examiner*—William M. Brewster
*Attorney, Agent, or Firm*—Blakely, Sokoloff, Taylor and Zafman LLP

[57] ABSTRACT

A method for making a MOSFET in a semiconductor substrate with self aligned source and drain contacts. The method comprises forming a gate oxide layer on the substrate followed by forming a polysilicon gate on the gate oxide layer. A liner oxide layer is formed on the gate and the gate oxide layer and nitride sidewall spacers are formed on the liner oxide layer and adjacent the sidewalls of the gate. A portion of the liner oxide layer and gate oxide layer that lies between the sidewalls of the gate and the nitride sidewall spacers is removed. An oxide layer is then formed around the gate. Next, source and drain regions are formed in the substrate adjacent to the sidewalls of the gate. Finally, a source contact and a drain contact is formed in the area between the gate and the nitride sidewall spacers.

12 Claims, 2 Drawing Sheets

METHOD FOR MAKING A MOSFET WITH SELF-ALIGNED SOURCE AND DRAIN CONTACTS INCLUDING FORMING AN OXIDE LINER ON THE GATE, FORMING NITRIDE SPACERS ON THE LINER, ETCHING THE LINER, AND FORMING CONTACTS IN THE GAPS

FIELD OF THE INVENTION

The present invention relates to metal-oxide-semiconductor field effect transistors (MOSFETs), and more particularly, to a method of manufacturing MOSFETs with source and drain contacts self-aligned with the gate.

BACKGROUND OF THE INVENTION

The MOSFET is perhaps the most manufactured semiconductor device in history. The MOSFET is a fundamental building block in any integrated circuit. From logic circuits to memory, the MOSFET is simply indispensable.

In simplest terms, the MOSFET is a three terminal device with electrical contacts leading to a source, a drain, and a gate. The source and the drain are formed in a semiconductor substrate by doping. The gate is formed between the source and drain atop the substrate (separated by a thin gate oxide). Electrical contacts to the "outside world" are then required for the source, drain, and gate.

While this basic MOSFET structure has been known for decades, with the shrinking of the MOSFET device down to deep submicron dimensions, it has become increasing difficult to form the source and drain electrical contacts reliably over the source and drain regions (which are typically formed self-aligned to the gate).

What is needed is a method for forming a MOSFET with self-aligned source and drain contacts.

SUMMARY OF THE INVENTION

A method for making a MOSFET in a semiconductor substrate with self aligned source and drain contacts is disclosed. The method comprises: forming a gate oxide layer on said substrate; forming a gate on said gate oxide layer, said gate having at least two sidewalls; forming a liner oxide layer on said gate and said gate oxide layer; forming nitride sidewall spacers on said liner oxide layer and adjacent said at least two sidewalls of said gate; removing a portion of said liner oxide layer and gate oxide layer that lies between said at least two sidewalls of said gate and said nitride sidewall spacers; forming an oxide layer around said gate; forming source and drain regions in said substrate adjacent to said at least two sidewalls of said gate; and forming a source contact and a drain contact in the area between said gate and said nitride sidewall spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
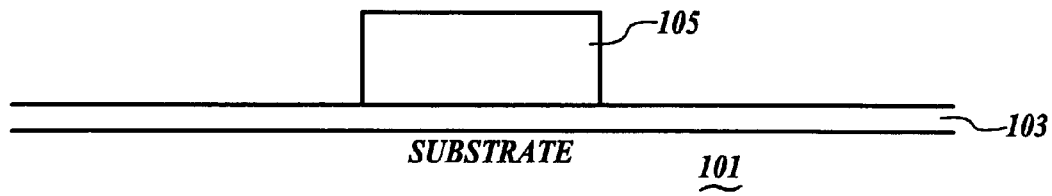
FIGS. 1–6 are cross-sectional views of a semiconductor substrate illustrating the steps in forming a MOSFET in accordance with the present invention.

Turning to FIG. 1, a p-type silicon substrate 101 is provided. Formed atop the substrate is a thin gate oxide layer 103. The gate oxide layer 103 may be formed by oxide deposition or by thermal oxidation and preferably has a thickness in the range of 50–100 angstroms.

Next, a gate 105 is formed atop of the gate oxide layer 103. While the gate 105 may be formed from any conductive material, the gate 105 is preferably formed from insitu doped polysilicon to a thickness of about 1000 angstroms. The gate 105 may be formed, for example, using conventional chemical vapor deposition (CVD) followed by a conventional masking and etching step. Moreover, although FIG. 1 shows that gate oxide 103 extends past the gate 105, it can be appreciated that the gate oxide 103 not covered by the gate 105 may also be etched away. For purposes of this invention, the gate oxide 103 need only be under the gate 105.

Figure 2:
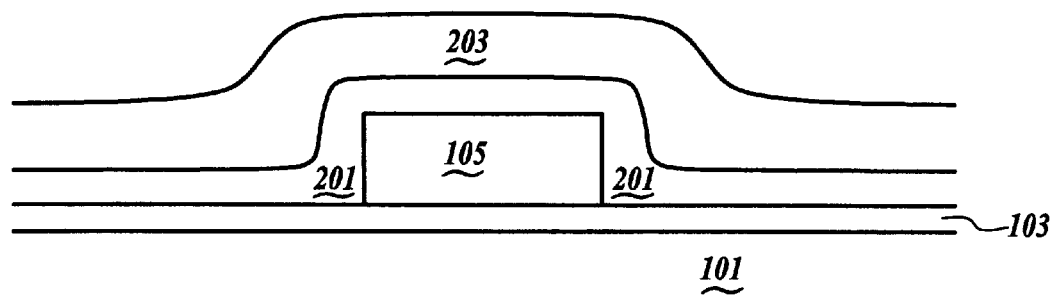

Turning to FIG. 2, a liner oxide layer 201 is formed over the gate 105 and the gate oxide layer 103. Preferably, the liner oxide layer 201 is formed from tetraethyorthosilicate (TEOS) oxide using CVD to a thickness of 200–5000 angstroms. Formed atop of the liner oxide layer 201 is a nitride layer 203. The nitride layer 203 is preferably formed from silicon nitride using CVD to a thickness of 500–3000 angstroms.

Figure 3:
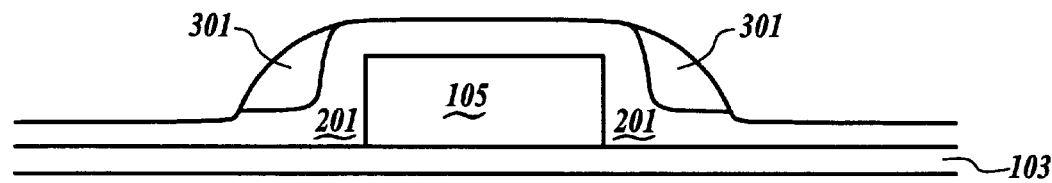

Next, turning to FIG. 3, the nitride layer 203 is anisotropically etched, such as by a reactive ion etch, to remove all of the nitride layer 203 except for nitride sidewall spacers 301 formed on the sidewalls of the liner oxide layer 201. In order to ensure that only the nitride sidewall spacers 301 remain of the nitride layer 203, an overetching should be performed. Thus, a portion of the liner oxide layer 201 is sacrificed.

Figure 4:
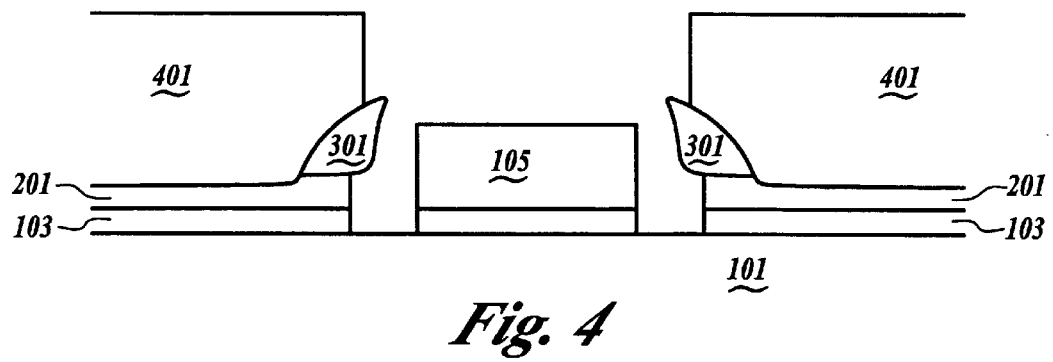

Turning to FIG. 4, a photoresist layer 401 is deposited and patterned onto the surface of the substrate. The photoresist layer 401 is patterned such that an opening falls upon the nitride sidewall spacers 301. In other words, the photoresist layer 401 should have a similar pattern to that used to form the gate 105, except that the pattern should be marginally larger around the gate opening periphery so as to include at least a portion of the nitride sidewall spacers 301.

After the photoresist layer 401 is deposited and patterned, an oxide etch is performed on the exposed liner oxide layer 201 and gate oxide layer 103 until the substrate 101 (at the source and drain) is reached. Preferably, the etch is an anisotropic reactive ion etch so that minimal undercut to the nitride sidewall spacers 301 takes place. Nevertheless, with suitable process control, a wet dip etch using a dilute HF solution may be alternatively be used. After the etching is finished, the result is seen in FIG. 4.

Figure 5:
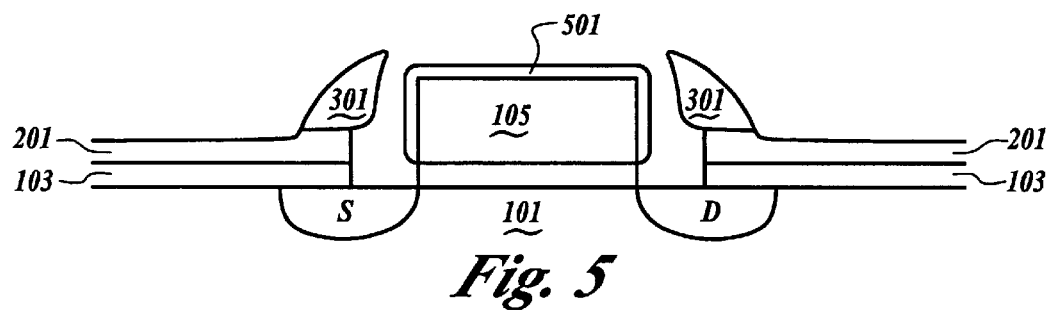

Next, turning to FIG. 5, the photoresist layer 401 is removed.

Additionally, the exposed walls of the gate 105 and the substrate 101 are thermally oxidized to form a silicon oxide layer 501 around the gate. The thickness of the silicon oxide layer 501 may range from 50–3000 angstroms. Additionally, the surface of the substrate 101 above the source and drain is also oxidized. The thermal oxidation process is controlled so that the silicon oxide layer 501 around the gate 105 is thicker than the oxide layer on the substrate 101. Although polysilicon oxidation rate depends upon grain orientation, dopant type, and dopant concentration, in general, lightly doped polysilicon oxidizes thermally more rapidly than {111} or {100} single crystal silicon. Therefore, it is relatively straightforward to form a thicker silicon oxide layer 501 around the gate 105 than over the substrate 101.

Next, source (S) and drain (D) regions are formed self aligned to the edges of the gate 105 using conventional ion implantation. Although not shown in FIG. 5, it can be appreciated that a lightly doped drain structure may optionally be formed for increased performance. Note that the foregoing step is well known in the MOSFET art.

Figure 6:
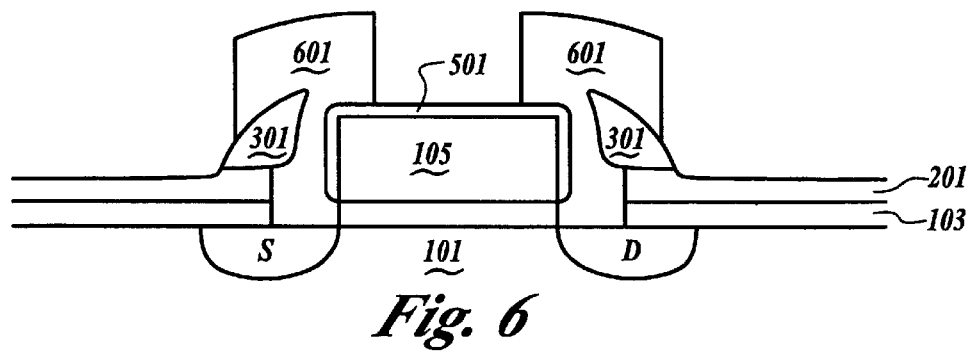

Turning to FIG. 6, the oxide atop of the source and drain is removed to expose the source and drain. This may be done by use of an anisotropic etch or by a quick wet dip in a buffered oxide etching solution. Because the silicon oxide layer 501 is made thicker than the oxide over the source and drain, the gate 105 remains electrically insulated.

Next, an insitu doped polysilicon layer is deposited by conventional CVD over the entire structure. Alternatively, the insitu doped polysilicon layer may be replaced by POCl$_3$ doped polysilicon. Preferably, the polysilicon layer has a thickness of about 1000 angstroms. As another preferred alternative, the polysilicon layer may be formed from implanted polysilicon to accommodate NMOS and PMOS devices separately. After the polysilicon layer has been deposited, conventional photolithography and etching is used to form the source and drain contact plugs 601 as seen in FIG. 6.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for making a MOSFET in a semiconductor substrate with self aligned source and drain contacts, the method comprising:

forming a gate oxide layer on said substrate;

forming a gate on said gate oxide layer, said gate having at least two sidewalls;

forming a liner oxide layer on said gate and said gate oxide layer;

forming nitride sidewall spacers on said liner oxide layer and adjacent said at least two sidewalls of said gate;

removing a portion of said liner oxide layer and gate oxide layer that lies between said at least two sidewalls of said gate and said nitride sidewall spacers;

forming an oxide layer around said gate; and forming source and drain regions in said substrate adjacent to said at least two sidewalls of said gate;

forming a source contact and a drain contact in the area between said gate and said nitride sidewall spacers.

2. The method of claim 1 wherein said gate and said source contact and said drain contact is formed from insitu doped polysilicon.

3. The method of claim 1 wherein said liner oxide layer is formed from tetraethylorthosilicate (TEOS) oxide.

4. The method of claim 1 wherein said nitride layer is formed from silicon nitride.

5. The method of claim 1 wherein said source contact and said drain contact is formed from POCl$_3$ polysilicon.

6. The method of claim 1 wherein said source contact and said drain contact is formed from implanted polysilicon.

7. A method for making a MOSFET in a semiconductor substrate with self aligned source and drain contacts, the method comprising:

forming a gate structure on said substrate, said gate structure formed from a polysilicon gate atop of a gate oxide, said gate structure having at least two sidewalls;

forming a liner oxide layer on said gate structure and substrate;

forming nitride sidewall spacers on said liner oxide layer and adjacent said at least two sidewalls of said gate structure;

removing a portion of said liner oxide layer that lies between said at least two sidewalls of said gate structure and said nitride sidewall spacers;

forming an oxide layer around said gate;

forming source and drain regions in said substrate adjacent to said at least two sidewalls of said gate structure; and forming a source contact and a drain contact in the area between said gate and said nitride sidewall spacers.

8. The method of claim 7 wherein said source contact and said drain contact is formed from insitu doped polysilicon.

9. The method of claim 7 wherein said liner oxide layer is formed from tetraethylorthosilicate (TEOS) oxide.

10. The method of claim 7 wherein said nitride layer is formed from silicon nitride.

11. The method of claim 7 wherein said source contact and said drain contact is formed from POCl$_3$ polysilicon.

12. The method of claim 7 wherein said source contact and said drain contact is formed from implanted polysilicon.

* * * * *